United States Patent [19]
Garrison et al.

[11] Patent Number: 5,449,659
[45] Date of Patent: Sep. 12, 1995

[54] METHOD OF BONDING MULTILAYER STRUCTURES OF CRYSTALLINE MATERIALS

[75] Inventors: Stephen M. Garrison, Palo Alto; Randy W. Simon, Belmont, both of Calif.

[73] Assignee: Conductus, Inc., Sunnyvale, Calif.

[21] Appl. No.: 973,966

[22] Filed: Nov. 9, 1992

Related U.S. Application Data

[63] Continuation-in-part of Ser. No. 726,032, Jul. 5, 1991, abandoned, and a continuation-in-part of Ser. No. 968,280, Oct. 29, 1992.

[51] Int. Cl.$^6$ .................................... H01L 39/00
[52] U.S. Cl. ................. 505/330; 505/329; 505/701; 505/702; 427/62; 148/DIG. 12; 437/86; 437/974; 156/182; 156/308.2
[58] Field of Search .............. 505/701, 702, 329, 330; 437/86, 974; 156/182, 308.2; 427/62, 63; 148/DIG. 12

[56] References Cited

U.S. PATENT DOCUMENTS

| | | | |
|---|---|---|---|
| 4,624,727 | 11/1986 | Scola et al. | 156/331.8 |
| 4,908,328 | 3/1990 | Hu et al. | 437/63 |
| 4,942,142 | 7/1990 | Itozaki et al. | 505/1 |
| 5,130,294 | 7/1992 | Char | 505/1 |
| 5,168,078 | 12/1992 | Reisman et al. | 437/195 |

FOREIGN PATENT DOCUMENTS

297734A5 1/1992 Germany.

OTHER PUBLICATIONS

"Biaxialy Aligned YBa$_2$Cu$_3$O$_{7-\delta}$ thin film tapes", Y. Iijima, et al., *Physica C*, 185-189, 1991, pp. 1959-1960.

*Primary Examiner*—Roy V. King
*Attorney, Agent, or Firm*—Judith A. DeFranco; Kimberly Elcess

[57] ABSTRACT

A method for producing multilayer structures comprised of materials with incompatible processing parameters is disclosed. A bonding layer of arbitrary dielectric constant is applied to each of two substructures. Each substructure is composed of a substrate and at least one epitaxial crystalline layer. Examples of particular bonding materials used are polyimide, fluorocarbon polymers, other organic materials, and glass. The bonding material may be applied like photoresist, or sputtered, or applied in any appropriate manner consistent with the processing constraints of the crystalline materials. Structures formable in this way include superconductor-amorphous dielectric-superconductor and ferroelectric-insulator-semiconductor trilayers, as well as microwave resonators and multichip modules.

17 Claims, 6 Drawing Sheets

METHOD OF BONDING MULTILAYER STRUCTURES OF CRYSTALLINE MATERIALS

GOVERNMENT RIGHTS

The government has certain rights in this invention pursuant to FAR 52.227-11(b) and 35 U.S.C. 203.

CROSS-REFERENCE TO OTHER APPLICATIONS

This application is a continuation-in-part of U.S. patent application Ser. No. 07/726,032 filed on Jul. 5, 1991, now abandoned, and also is a continuation-in-part of U.S. patent application Ser. No. 07/968,280, filed on Oct. 29, 1992, and both of them are assigned to the assignee of the present invention and having a common inventor, and which are hereby incorporated by reference in their entirety.

FIELD OF THE INVENTION

This invention relates to a multilayer structures of use in electronics applications. More particularly, the invention relates to structures having at least three layers, wherein the outer layers must be crystalline to be useful in the application and the center material is amorphous, or otherwise incompatible with the crystal structure of the outer materials. This structure is particularly useful for interconnect substrates for multichip modules and microwave electronic circuits.

BACKGROUND OF THE INVENTION

For many applications, it is advantageous to employ multilayer structures which consist of materials whose processing requirements are not necessarily compatible. In particular, some crystalline materials only display desirable qualities when they are highly ordered. Examples are silicon, whose electrical behavior varies dramatically from the single crystal to polycrystalline films to amorphous layers, quartz, which is only piezoelectric in its crystalline state, and high temperature superconductors, which have very high critical current densities only when all of the individual grains of a sample are strongly aligned. Technology exists to produce most materials in their preferred forms, but processing windows can be very narrow. The result is that it is virtually impossible to produce certain structures which incorporate a material of this type with a different material when the two materials' narrow processing windows do not overlap.

One such desirable structure consists of two or more conducting layers spaced apart by intervening layers of insulating, or dielectric, materials. A particular example is the interconnect substrate for a multichip module. Up to several dozen layers, as many as 64 in one case, of a conductor such as copper are separated by insulating layers, often polyimide, to form a platform on which many semiconductor integrated circuits, or chips, can be supported and electrically interconnected. This very large number of layers derives from the need for a large the number of connections whose dimensions are constrained by the resistivity of copper and the attendant problem of heat dissipation. In principle, topology and function necessitate only four layers: power, ground, and two signal planes.

The 1986 discovery of superconductivity at temperatures more practical than that of liquid helium (up to 125K in some cuprates) sparked interest in using superconductors as interconnects in multichip modules (MCM's). If several dozen layers of interconnect could be replaced by two layers of superconducting interconnect, MCM's would be far less complex and expensive to manufacture. Furthermore, interconnect layouts could be kept much simpler, involving only two planes rather than complex three-dimensional structures containing numerous layers. In order to achieve the replacement, however, technological innovations were required. First, the superconductors must be able to carry large currents for long distances in narrow lines. Second, the dielectric material must have a low dielectric constant to minimize the propagation time of the signals. Third, the dielectric layer must have an appropriate thickness to provide impedance matching between the interconnects and the devices to which they connect. For standard 50-$\Omega$ lines, the dielectric thickness must be comparable to the conductor width. Of course, the structure must remain intact during processing for it to have any value at all. So far it has not been possible to meet all of these goals by growing a series of epitaxial layers. The peculiarities of the crystal chemistry of the perovskite superconductors has severely restricted the combinations of substrates, superconductors, and insulators that can be used together. Ferroelectric materials which have similar crystal structures and chemistries have similar problems with incompatibility. The table below sets out the electrical properties of currently available epitaxial insulators which can be used with high temperature superconductors and related ferroelectrics.

TABLE 1

| Available epitaxial dielectric materials. | | |
|---|---|---|
| Material | Lattice Constant | Dielectric Constant |
| $Al_2O_3$ | r-plane 0.348 nm | 9–10 |
| MgO | 0.421 nm | 10 |
| $CeO_2$ | 0.541 nm | 11–15 |
| $LaAlO_3$ | 0.379 nm | 23 |
| YSZ | 0.514 nm | 25 |
| $SrTiO_3$ | 0.391 nm | 150 |
| $CaTiO_3$ | 0.382 nm | 1000 |
| $BaTiO_3$ | 0.401 nm | 1650 |

This trilayer structure, comprising a conducting layer, a dielectric layer, and another conducting layer, is a common geometry used in thin film multilayer electronic devices. A typical example of such a structure is a microstrip transmission line. The present invention deals with the case in which the conducting layers must have specific crystalline orientations as typically provided by their epitaxial growth on selected substrates. Conventionally, to produce the trilayer structure using these materials requires the use of a dielectric layer whose crystalline properties permit epitaxial growth of the conducting layers. Furthermore, in order to process such structures, the growth conditions for the materials, (in terms of temperature, ambient atmosphere, etc.) must be mutually compatible in order to preserve the properties of the constituent layers. In this invention we describe a means of producing the desired trilayer structures in which the restrictions upon the dielectric layer are essentially eliminated.

Another application in which it is desirable to incorporate incompatible materials into a single mechanically stable structure is the case of a ferroelectric memory structure on top of a silicon-based integrated circuit. Since ferroelectric coefficients vary with crystallographic direction, it is necessary for the crystal grains to be highly aligned to take advantage of the hysteresis of these materials. Silicon must also be single crystalline for it to be useful in integrated circuits. (Polysilicon has its own unique properties, but its transport properties are inferior to those of single crystal silicon.) If it were possible to deposit a relatively thick isolation layer on top of the silicon circuitry and then grow the ferroelectric film on top of that with good alignment of the individual grains, these composite structures could be quite useful. Unfortunately, ferroelectrics have rather complicated crystal structures, similar to the high temperature superconductors, and attempts to deposit them on arbitrary materials have resulted in poorly aligned films. By decoupling the growth of the crystalline layers from the deposition of the central isolation layer, the present invention circumvents the problem of incompatible processing conditions in the different materials.

DISCUSSION OF THE PRIOR ART

Because the field of high temperature superconductivity (HTS) is relatively young, very little has been reported in the area of HTS MCM's. To applicants' knowledge, this is the first report of a technologically feasible method of forming a structure with multiple superconductive layers separated by a dielectric material at least 0.5 µm thick and having an arbitrarily low dielectric constant. Nevertheless, below are some examples of approaches that have been tried by ourselves and others.

Newman, et al., in U.S. patent application Ser. No. 07/726,032, assigned to the assignee of the present invention and having a common inventor and of which this application is a continuation-in-part, disclose a method for producing superconductive layers on either side of a substrate which has been thinned to less than 250 µm. While the resulting structure may resemble this invention in some respects, the choice of dielectric material is restricted to materials which provide good substrates for the epitaxial crystal growth of high temperature superconductors.

Another proposed solution to the problem of using substrates without structural compatibility with high-temperature superconductors is the ion-assisted sputter deposition technique practiced by researchers at Fujikura Ltd. in Japan. See, for example, Y. Iijima, et al., "Biaxially aligned $YBa_2Cu_3O_{7-\delta}$ thin film tapes," *Physica C*, 185–189 (1991) pp. 1959–1960. In this technique, a substrate such as metal is subjected to an ion milling process during the sputter deposition of a buffer layer material suitable for subsequent perovskite superconductor film growth. The buffer is deposited randomly, with no preferred orientation, onto the polycrystalline or otherwise incompatible substrate. The ion beam is controlled and directed so that removal of material lacking a preferred orientation proceeds more quickly than does removal of desirably oriented material. In this way, the residual film is more or less oriented in the desired direction as growth proceeds. An obvious drawback to this technique is the slow growth rate due to removal of misoriented material. That is, growth proceeds by taking two steps forward and one step back. A more crucial drawback for MCM applications, however, is the processing environment to which the substrate is subjected. Polymeric dielectrics, for example, cannot withstand the high temperatures and lengthy exposure to a high-energy ion beam required by these deposition conditions.

OBJECTS AND ADVANTAGES

It is therefore an object of the present invention to produce multilayer structures of crystalline layers on opposite sides of a bonding layer which is incompatible with the growth of high quality crystalline films. This bonding layer may be chosen to have a specific dielectric constant or a range of dielectric constants. It is thermally compatible with the remainder of the structure from its own processing temperature down to cryogenic temperatures.

It is a specific object of the present invention to produce conductor-insulator-conductor structures where the conductors must be crystalline and highly ordered and where the insulator is not compatible with the processing conditions necessary to produce such crystalline conductors.

It is a further object of this invention to provide a structure having multiple layers of conductor separated by a dielectric having a dielectric constant less than 5, even as low as 2.

It is a specific object of this invention to produce a structure having multiple layers of oxide superconductor separated by a dielectric having a dielectric constant less than 5, even as low as 2.

Yet another object of this invention is to provide a multichip module structure which incorporates high temperature superconductors as the conducting material and has a high propagation velocity.

A further object of the invention is to provide an MCM structure in which the dielectric material contributes minimal capacitance.

Still another object of the invention is to provide a high-speed microwave transmission line structure incorporating two superconductive layers separated by a material with a low dielectric constant, whose thickness is chosen to match an impedance of 50 Ω.

SUMMARY

The present invention consists of producing the component crystalline layers on separate substrates, coating each crystalline layer with a film of the desired dielectric layer such that the sum of the two dielectric thicknesses equals the desired total thickness of dielectric, and then fusing the two substructures with the dielectrics facing. In the case in which the crystalline layers can be damaged or otherwise impaired by direct contact with the dielectric material, additional thin film layers may be inserted between the crystalline layer and the chosen dielectric. The ultimate structure produced in this way can be more complex than the trilayer, as there could be additional crystalline layers, conductive or insulating, on either side of the trilayer.

This technique is particularly useful when the crystalline materials are high-temperature (perovskite, cuprate, oxide) superconductors—which must be grown with controlled crystalline orientation in all three axes in order to exhibit desirable electrical properties—and the dielectric materials are low-dielectric-constant materials used for high-speed transmission lines. Examples of these dielectrics include polyimides, fluorocarbon polymers, other organics, and silica glass. In this case, the dielectrics are amorphous in nature and are incompatible with the superconductors from the standpoint of both structure and processing conditions.

DEFINITIONS

A few words and phrases have taken on special meaning in the arts of crystal growth, high temperature superconductivity, microwave circuit design, and multichip module fabrication, to which the present invention pertains. The following definitions are provided to clarify such special meanings for these words and phrases as they are used in the specification of this invention.

Thin film: layer of material whose thickness is easily attainable by epitaxial crystal growth methods, from 1 monolayer (approximately 0.5 nm) to approximately 1 micrometer.

Thick film: layer of material whose thickness is greater than that easily attainable by epitaxial crystal growth methods, from approximately 1 $\mu m$ to approximately 1 mm.

High temperature superconductors: also known as oxide, cuprate, perovskite, or ceramic superconductors; materials having a superconducting transition temperature above approximately 30K.

Epitaxial: layer of material grown on top of another layer (substrate) of the same material or a different material, and which bears a definite crystallographic relationship to the substrate. While this term was originally applied only to single crystal films on single crystal substrates, it is now widely used to refer to layers which are more subtly influenced by the substrate. In particular, high temperature superconductor layers are said to be epitaxial when all of the individual grains are aligned so that either the c-axis or the a/b-axes are perpendicular to the plane of the substrate and the remaining unit cell axes are parallel to specific crystallographic directions of the substrate. The resulting film may be twinned, but it has no high-angle ($5° < \Theta < 85°$) grain boundaries.

DETAILED DESCRIPTION OF THE INVENTION: PROCESS DESCRIPTION

Figure 1:
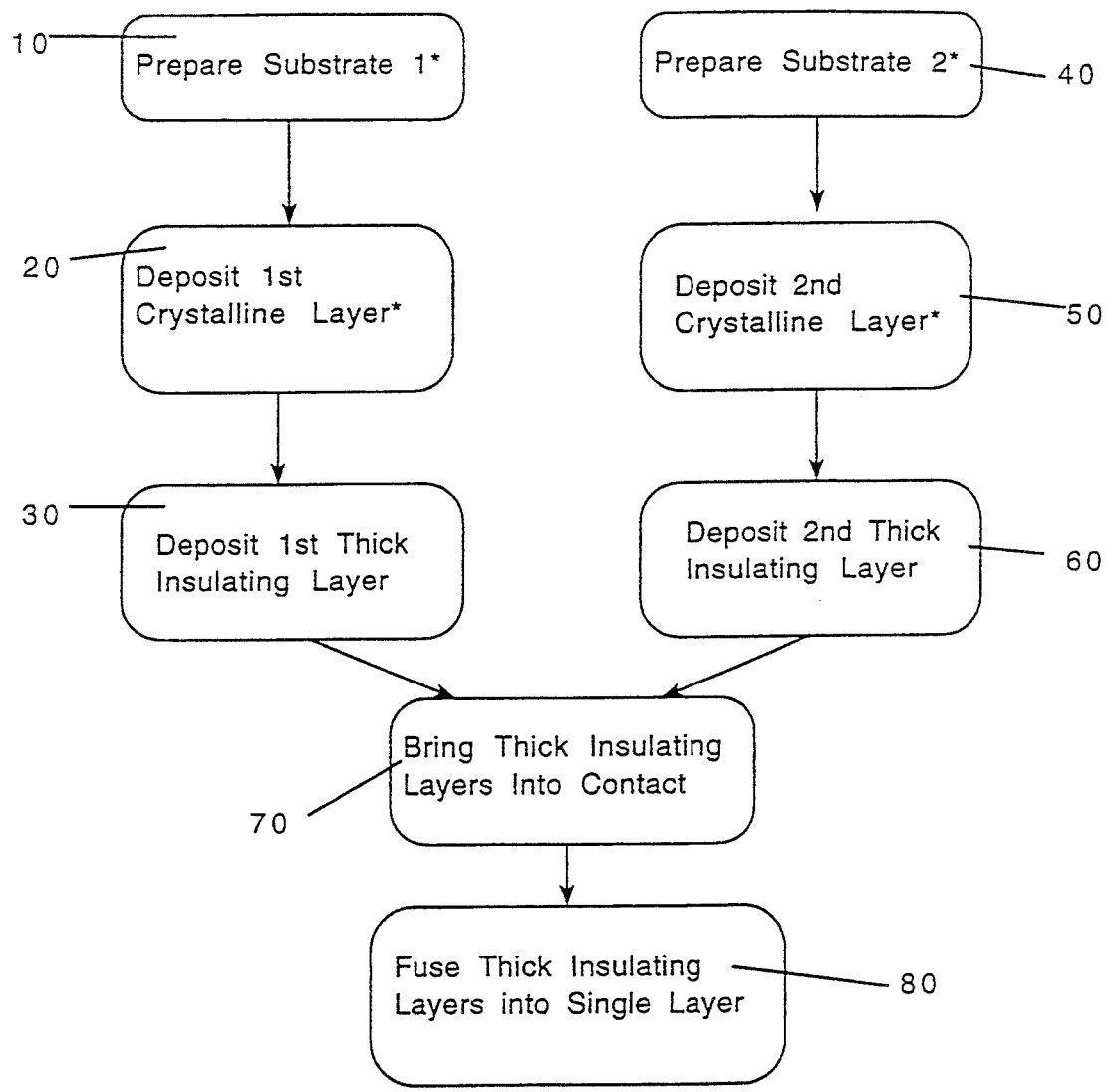
FIG. 1 is a block diagram of the simplest suggested process flow.

As shown in FIG. 1, the process according to the invention is based on a series of layer deposition and patterning steps. Flexibility in the process is provided by several branch points, marked by an asterisk (*) in the Figure. To facilitate understanding, the simplest basic process is described first, followed by some of the variations possible in this fabrication sequence. Process steps are numbered as in FIG. 1, while parts of the structure produced by the process are numbered as in FIGS. 2a and 2b.

Figure 2A:
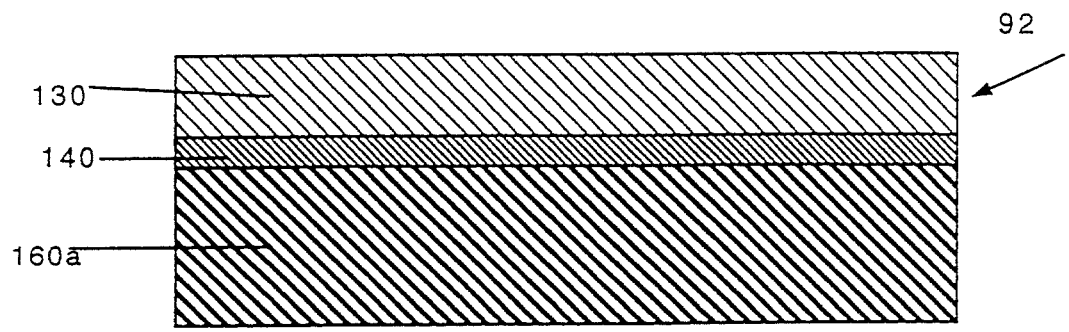
FIGS. 2a and 2b are schematic partial cross-sections of the simplest multilayer structure resulting from the process of FIG. 1.
Figure 2A:
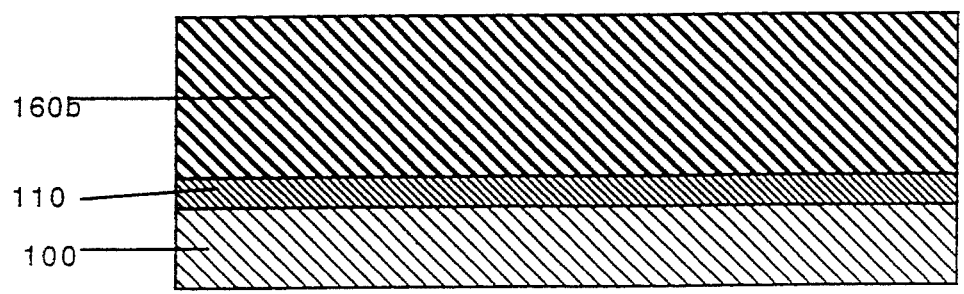
Figure 2B:
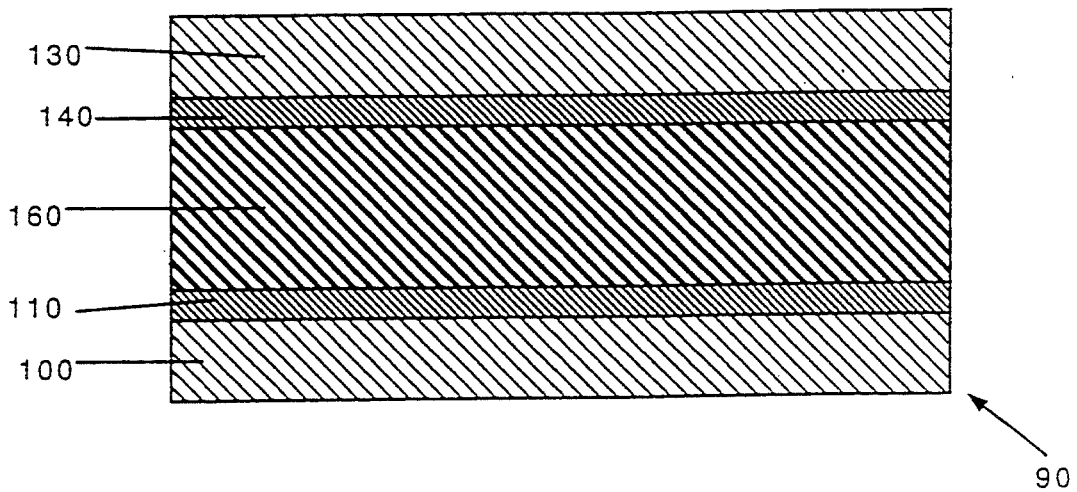

Referring to FIGS. 1, 2a and 2b, a first substrate 100 are first prepared 10 for deposition of the first crystalline layers. Substrates 100, 130 are chosen for their dielectric properties, their cost, and their ability to support epitaxial crystal growth of the crystalline materials of choice. Substrates 100, 130 may be cleaned with solvents and/or acid solutions, or they may be used as received from the vendor or crystal growth department. Clean substrates 100, 130 are then mounted in the crystal growth apparatus. Mounting may entail physical bonding to a heater block or susceptor, or mere secure placement atop a heating block or in a sample retaining ring. Such placement depends on the geometry of the crystal growth system used and does not constitute an important part of this invention. Finally, for some combinations of substrate materials and conductor materials it may be necessary or desirable to deposit one or more buffer layers before deposition 20 of the crystalline layer. In such cases, substrate preparation is understood to include the deposition of the buffer material(s) as well as all other steps necessary to prepare the substrate for deposition of the chosen crystalline material. A second substrate 130 undergoes similar preparation 40.

The next step is the deposition 20 of the first crystalline layer 110. Because this invention is directed specifically to cases in which this material must be crystalline and highly oriented to perform adequately, the choice of deposition technique is somewhat limited. Possibilities include physical deposition techniques like sputtering, molecular beam epitaxy, laser ablation, and evaporation, chemical deposition techniques like metalorganic chemical vapor deposition (MOCVD) and plasma-enhanced chemical vapor deposition (PECVD), and other techniques such as liquid phase epitaxy (LPE) and sol-gel techniques. While the currently preferred methods of deposition are in situ processes which result in films having desired properties upon removal from the crystal growth apparatus, ex situ techniques may also be employed. The deposition technique chosen must be capable of producing a highly oriented, highly crystalline film on the surface of the prepared substrate. In the particular case of a high temperature superconductor film, for example, the film must be "epitaxial." (In the field of high temperature superconductivity, the definition of "epitaxial" is expanded to include layers which contain no high-angle ($5° < \Theta < 85°$) grain boundaries whether or not the films are single crystal or commensurate with the substrate.) Many such techniques are known to those skilled in the art of crystal growth of thin films.

A similar film of crystalline material 140 is deposited 50 on the second substrate 130. This material may be the same as that deposited on the first substrate 100 or it may be a different crystalline material.

In the simplest case, the substrate 100, 130 and epitaxial layer 110, 140 composite structures are next removed from the crystal growth apparatus and the epitaxial layers 110, 140 are patterned as desired. A layer of dielectric material 160a, b having a low dielectric constant is applied 30, 60 to each layer of crystalline material 110, 140 forming two substructures 92, 94. For the specific case of transmission lines, the thickness of this layer is chosen so that, when the two structures are placed in contact 70, the thickness of both low-dielectric-constant layers 160a, b is sufficient to match the impedance of the transmission line so formed to an impedance of 50 $\Omega$. This thickness will depend on the linewidth used in the patterned film or films. Since shrinkage may occur during later heat treatment, the thicknesses of these layers 160a, b as applied may not add to the ultimate desired thickness.

The low-dielectric-constant material 160a, b may be applied 30, 60 in one of several ways. The material 160a, b may be spun onto the crystalline layers 110, 140, similar to spinning on photoresist. It may be sprayed on, or the structure may be dipped in liquid dielectric or a solution containing dissolved dielectric. For these application techniques, polyimides and liquid fluorocarbon polymers (for example, Teflon ®, a product of DuPont) are very attractive dielectric materials. If the material of choice is quartz glass, sputtering may be an appropriate method of forming a thick film on the crystalline material.

Figure 3A:
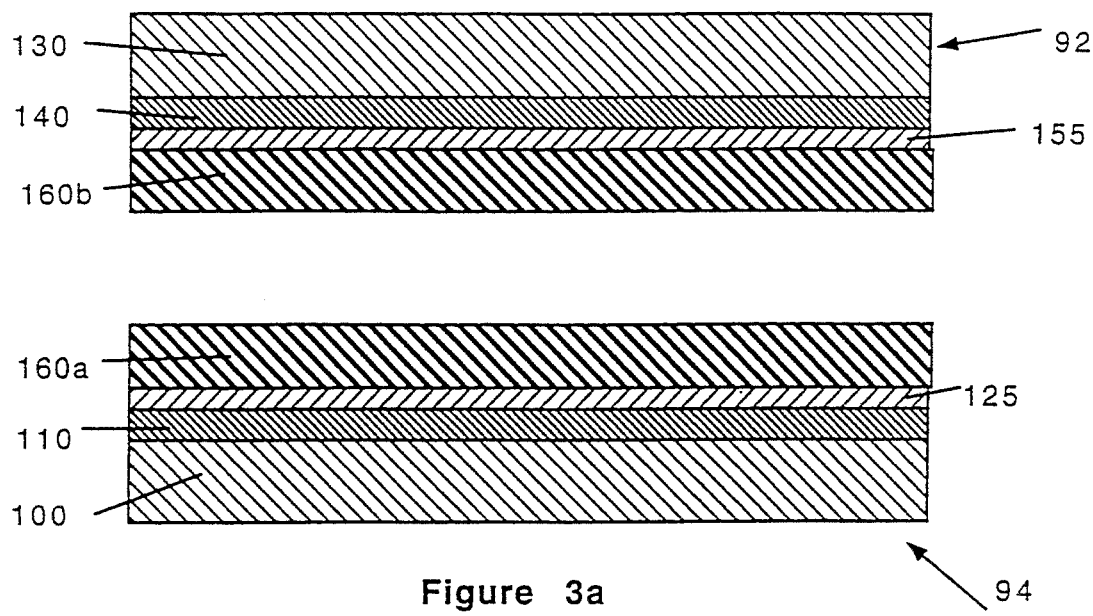
FIGS. 3a and 3b are schematic partial cross-sections of a slightly more complex multilayer structure resulting from the process of FIG. 1.
Figure 3B:
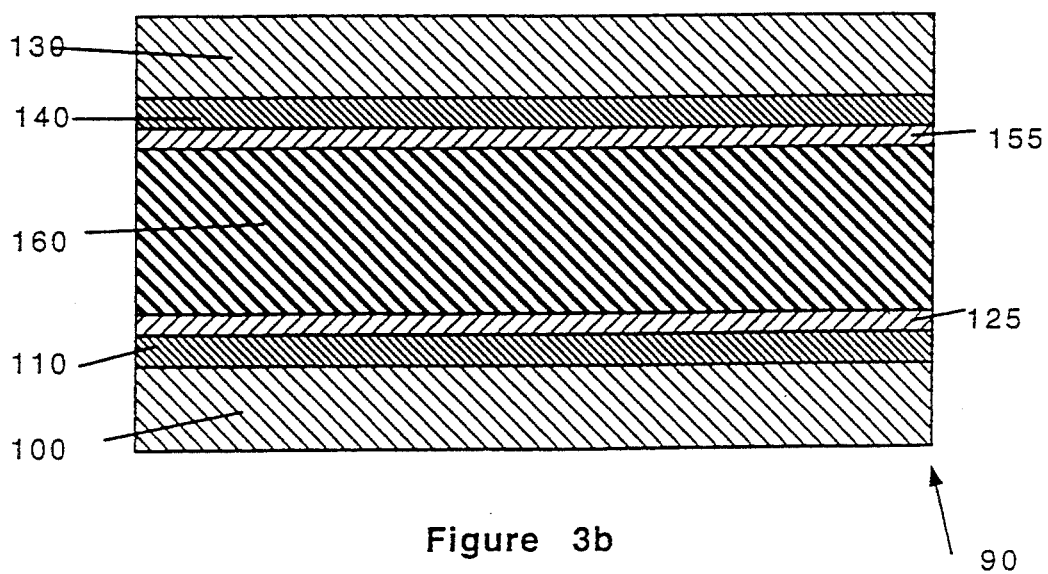

After the material 160a, b is applied 30, 60 to each substrate-epitaxial layer substructure 92, 94, the two substructures 92, 94 are brought into contact 70 with the thick dielectric layers 160a, b facing each other. The two layers of dielectric 160a, b are then fused 80 to become a single layer 160. In the case of polyimide, the fusion 80 takes place by heating the substrate-crystalline-dielectric-crystalline-substrate (SCDCS) structure 90 to the polymer's curing temperature and allowing the polymer to cure. In the case of glasses, regardless of the method of application, the two dielectric layers 160a, b must be fused 80 by heating to the flow temperature of the glass. Either way, the bonding material 160a, b must be chosen so that its cure or flow temperature and atmospheric requirements do not degrade the quality of the epitaxial layers 110, 140. As illustrated in FIGS. 3a and 3b, this may be ensured by depositing a protective layer 125, 155 on top of the epitaxial layers 110, 140 before applying the bonding material 160a, b.

Specific examples and more sophisticated variations on this basic process are explained in more detail below. The basic process can be seen, however, to consist of only the following steps:

1. Depositing 20 a first epitaxial layer 110 on a first substrate 100 which has been previously prepared 10.
2. Depositing 50 a second epitaxial layer 140 on a second substrate 130 which has been previously prepared 40.
3. Depositing 30, 60 a thick bonding layer 160a, b on each epitaxial layer 110, 140.
4. Bringing the two bonding layers 160a, b into contact 70.
5. Fusing 80 the two bonding layers 160a, b into a single layer 160.

Figure 6:
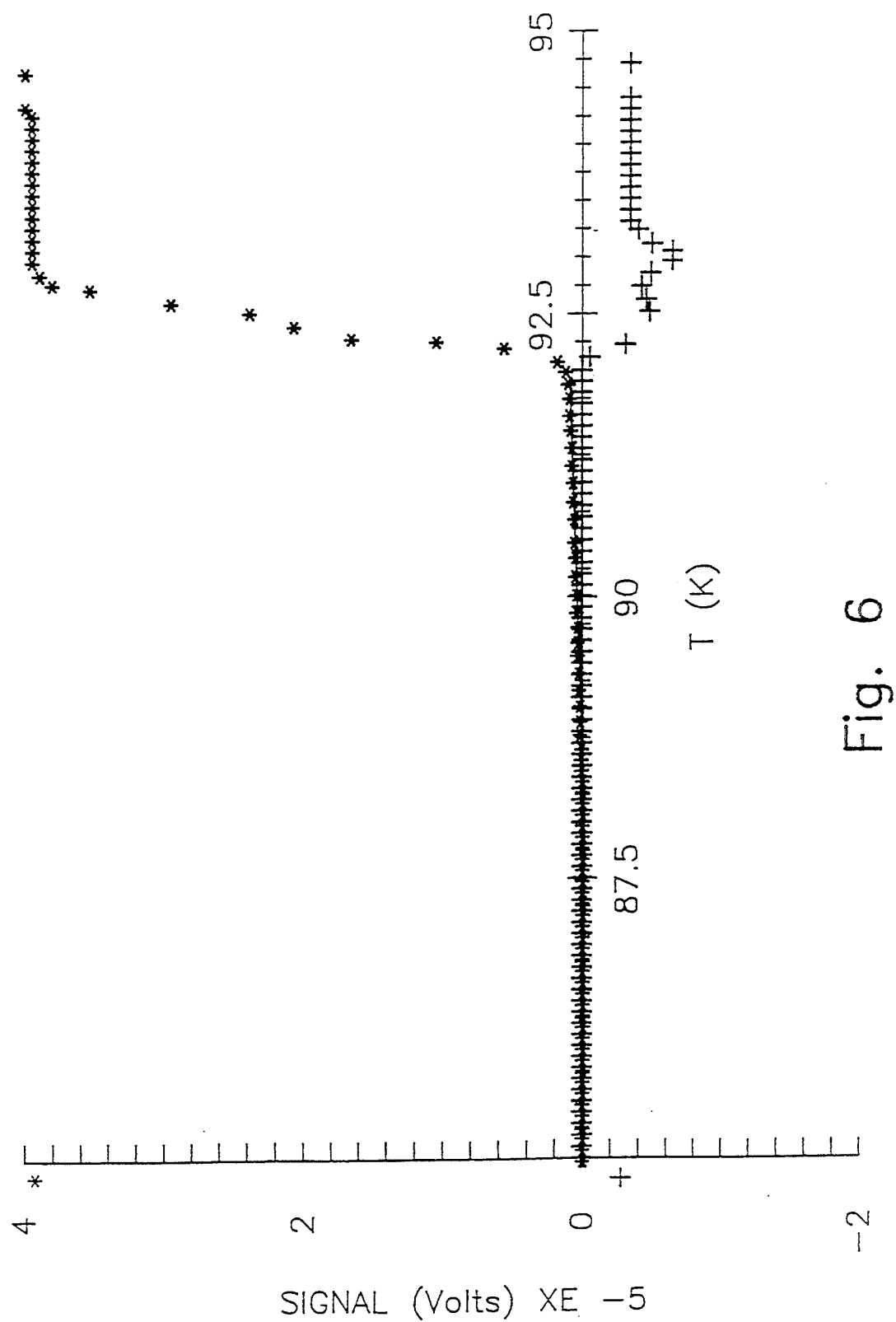
FIG. 6 shows the superconducting transition of an $YBa_2Cu_3O_{7-\delta}$ film as measured by mutual inductance after bonding according to the method of the invention.

A specific example of a structure made using the process flow described above is shown schematically in FIGS. 3a and 3b. Two substrates of LaAlO$_3$ 100, 130, about 0.020-inch (0.5-mm) thick, were cleaned in solvents. The substrates 100, 130 are then mounted side-by-side on a substrate heater. YBa$_2$Cu$_3$O$_{7-\delta}$ 110, 140 is then sputtered onto the heated substrates 100, 130 from an off-axis rf-magnatron source. After growth, the superconducting samples are removed from the sputter chamber and are mounted in an electron beam evaporation system. A film of MgO 115, 145 approximately 300-nm thick is deposited on each superconducting layer 100, 130 to protect the surface. The coated substructures 92, 94 are then heated to approximately 750° C. at a rate of about 3° C. per minute in an atmosphere of flowing oxygen. The substructures 92, 94 remain at 750° C. for about 1 hour and are then cooled at approximately 3° C. per minute to a temperature of about 450° C., where they remain for approximately 4 hours. After this soak, the substructures 92, 94 are cooled to room temperature under flowing oxygen. When the samples have cooled, approximately 400 nm of polyimide 160a, b is applied to the coated superconducting layers or substructures 92, 94. The particular product used in our trials was DuPont PI 2546, which was applied by spinning at 4000 rpm. The spun-on polyimide 160a on the first substructure 92 was then soft baked at about 100° C. in air for 2 minutes. The second substructure 94 was flip-chipped (the polyimide layers 160a, b brought into contact with each other) to the first substructure 92. The entire structure 90 is then subjected to a moderate pressure, approximately 3 psi compression, while it is held at 100° C. for about 5 minutes. Magnetic measurements of the superconducting transition temperature for this test structure, shown in FIG. 6, indicate that the superconducting properties of the YBa$_2$Cu$_3$O$_{7-\delta}$ are not degraded by the bonding process 80.

EXEMPLARY STRUCTURES

A specific application for which this technique may be desirable is that of the interconnect board for a multichip module in which all conducting layers are high-temperature superconductors and the dielectric layer between the superconducting signal planes and the underlying superconducting ground plane should have as low a dielectric constant as is feasible. In this case, the interconnect board is fabricated as above, with the following variations as shown in the block diagram of FIG. 4.

Figure 4:
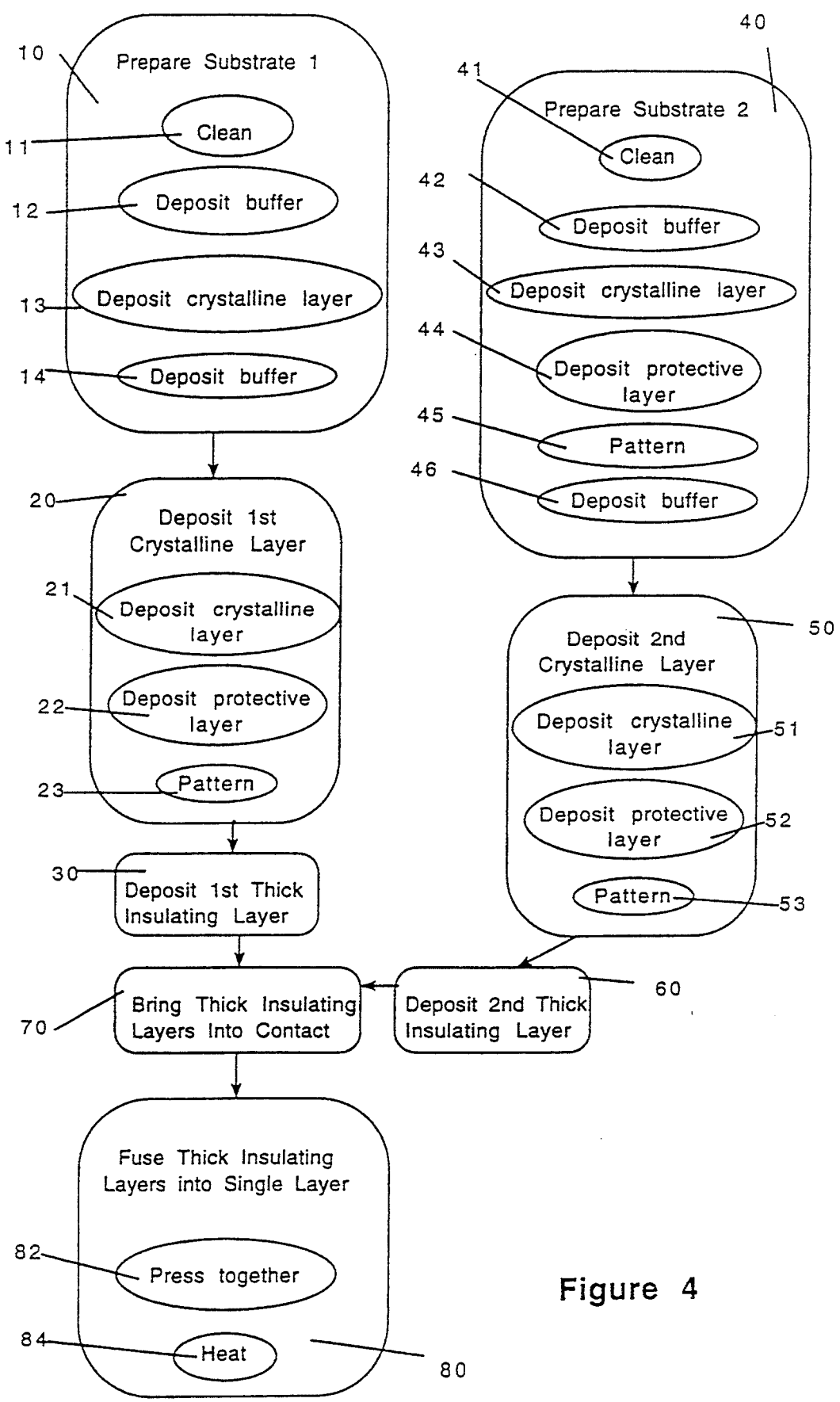
FIG. 4 is a block diagram of a more sophisticated implementation of the process of the invention.

FIG. 4 shows a flow diagram for a more sophisticated process, such as would be used for the interconnect substrate of a multichip module. Here steps 10, 20, 40, and 50 of FIG. 1 are shown in more detail. The first substrate 100 is cleaned 11, and, for maximum current-carrying capacity, a thin buffer layer 105 is deposited 12. Next, the power plane, a crystalline layer of superconductor 120, is deposited 13 epitaxially on the buffer layer 105. This crystalline layer 120 is covered 14 by an epitaxial protective or buffer layer 115. Next the ground plane 110 is deposited 21 epitaxially on this buffer layer 115. A final protective layer 125 is deposited 22 on the ground plane 110, and the protective layer 125 and the ground plane 110 are patterned 23. A thick coating of dielectric 160a is then applied 30 to the patterned substructure 92.

The second substrate 130 is also cleaned 41, and a buffer layer 135 is deposited 42. Next, the x signal plane, a crystalline layer of superconductor 150, is deposited 43 epitaxially on the buffer layer 135. This crystalline layer 150 is covered 44 by an epitaxial protective or buffer layer 145 and the ensemble is removed to a patterning area. Here the epitaxial layers 135, 150, 145 are patterned 45 by photolithographic techniques and selective removal of material (etching). After patterning 45, the patterned structure is returned to the growth area and a further buffer layer 145a may be grown 46 if desired. Next the y signal plane 140 is deposited 51 epitaxially on this buffer layer 145. A final protective layer 155 is deposited 52 on the y signal plane 140, and the protective layer 155 and the y signal plane 140 are patterned 53. A thick coating of dielectric 160b is then applied 60 to the patterned substructure 94.

The two substructures 92, 94 are brought into contact 70 at the dielectric 160a, b. Contact is maintained during fusion 80 by application 82 of a moderate pressure. Fusion 80 is accomplished by heating 84 the structure 90 to the cure temperature of the bonding layer 160 under this load and holding the structure 90 at temperature long enough for the bonding layers 160a, b to cure and fuse into a single layer 160.

Figure 5A:
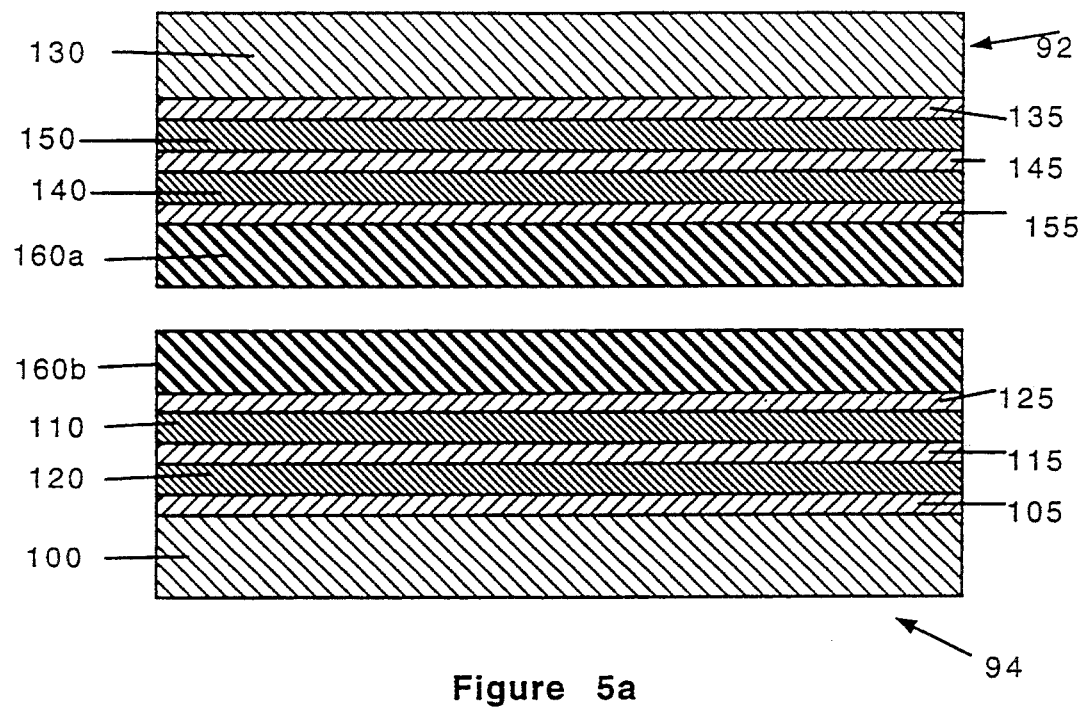
FIGS. 5a and 5b are schematic partial cross-sections of a complex multilayer structure resulting from the process of FIG. 4.
Figure 5B:
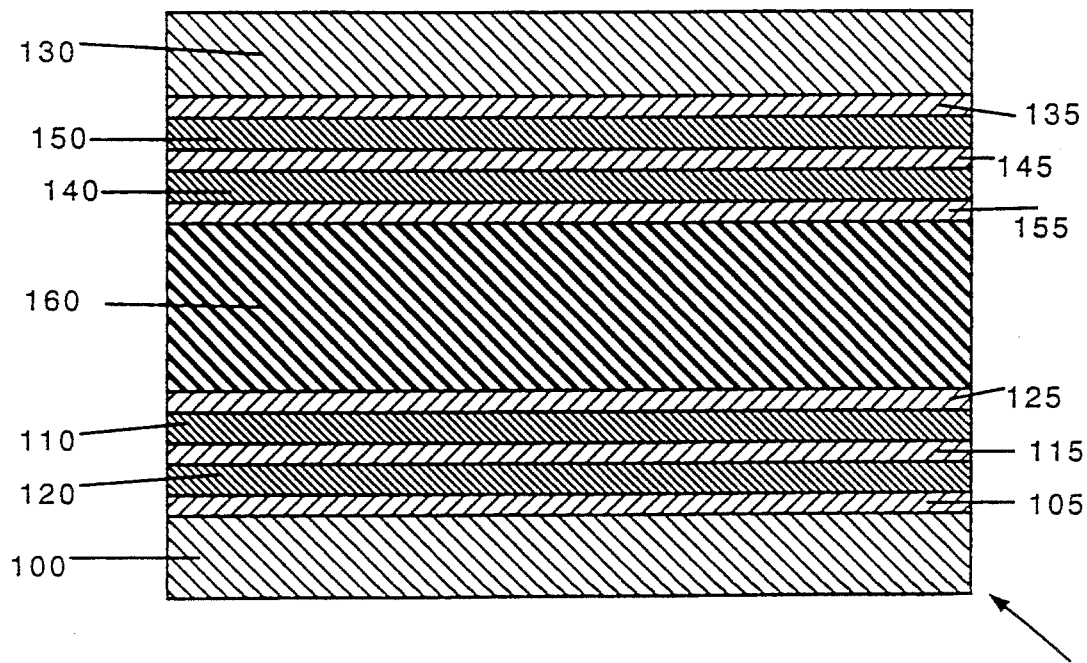

As seen in FIGS. 5a and 5b the final structure 90 is composed of two substructures 92, 94 separated by a thick dielectric layer 160. The first substructure 92 contains a superconducting power plane 120, a high dielectric constant insulating layer 115, a superconducting ground plane 110, and one part of the composite dielectric layer 160a. This is known as the power/ground substructure 92. The second substructure 94 contains two superconducting signal layers 150, 140 separated by a crystalline dielectric layer 145 and the second part of the composite dielectric layer 160b. This is known as the signal substructure 94.

The substrates 100, 130 are chosen for their structural and processing compatibility with the crystalline layers 105, 110, 115, 120, 125, 135, 140, 145, 150, 155. Suitable substrate materials are yttria-stabilized zirconia (also known as YSZ, $ZrO_2$:Y, and cubic zirconia), lanthanum aluminate $LaAlO_3$, neodymium gallate $NdGaO_3$, sapphire (single crystal $Al_2O_3$), magnesium oxide MgO, and strontium titanate $SrTiO_3$, among others. The buffer layer 105, 135 may be $PrBa_2Cu_3O_{7-\delta}$, MgO, $SrTiO_3$, $CeO_2$, or any other suitable material, or it may be a multilayer structure comprised of individual layers of these materials or other oxides. The superconductive layers 110, 120, 130, 140 are relatively thick, about 300 nm. Appropriate materials are $YBa_2Cu_3O_{7-\delta}$ (also known as YBCO) and rare earth cuprates. The insulating layers 115, 145 are necessary to prevent shorting between the superconductive layers 110, 120, and 130, 140. The insulating layers 115, 145 must be grown epitaxially on the superconductive layers 120, 150 and superconductive layers 110, 140 must be grown epitaxially on the insulators 115, 145. Appropriate materials include all of the buffer layer materials as well as any of the substrate materials. Buffer layers can be deposited on either side of the insulator to improve the properties of the insulator and/or the second superconducting film. The thin protective layer 125, 155, for example, 30 nm of $CeO_2$, is deposited to prevent damage during patterning and bonding.

The MCM interconnect substrate 90 formed according to the invention may be modified for connection to the chips themselves. After the substructures 92, 94 are bonded, holes may be opened through the dielectric to allow contact between the ground plane and each chip 170 to be mounted, and between the chip leads and the signal planes. In some cases, one or both substrates may be entirely removed.

Integrated circuit die 170 are attached to this structure following either of two approaches. The first approach is to remove the substrate from the signal plane side by some specialized etching technique and attach the die directly to the exposed layers. The second technique consists of producing the signal plane substrate with a series of appropriately located holes, perhaps opened in advance of the deposition processes, that allow the die to be attached through the substrate.

A second particular example of the utility of this bonding technique is the production of microwave resonators. As disclosed in our earlier patent application Ser. No. 07/726,032, assigned to the assignee of the present invention and having a common inventor, it usually desirable to have the ground plane separated from the microstrip delay line by a dielectric material whose thickness is approximately the same as the width of the line in the patterned film. The solution proposed by Newman, et al., is to grow a layer of superconductor on one side of a substrate, bond the substrate to a carrier, thin the substrate to the desired thickness, and deposit a second superconducting layer on the opposite side of the original substrate. That is a very good method when it is possible to use a good substrate material as the substrate.

The present invention provides a solution when such a choice of dielectric material is too restrictive. The process according to the present invention is to deposit the ground plane on one substrate as described above. Since this substrate will not be an active part of the device, it can be chosen with regard only to its chemical and structural suitability for the epitaxial growth of a high-quality layer of high-temperature superconductor. A protective layer is then deposited, and a layer of liquid fluorocarbon polymer is applied. The polymer is chosen for its very low dielectric constant, which enables very short signal propagation times.

The microstrip is deposited on a second substrate, along with buffer and protective layers. The microstripline is patterned after crystal growth to produce the desired pattern. After patterning, the second part of the dielectric layer is applied to this substructure. The two substructures are then brought into contact at the dielectric faces and are fused. After bonding, one or both substrates can be completely or partially removed, if desired. It would thus be possible to combine the present invention with the teaching of our earlier application to produce even more complex structures having, for example, three or even four multilayer epitaxial structure spaced apart by two or three distinct layers of thick dielectric material.

CONCLUSION, RAMIFICATIONS AND SCOPE

Upon reflection, it will become clear to those skilled in the arts of thin film crystal growth, high temperature superconductivity, microwave circuit design, and multichip module fabrication that this bonding technique is applicable to many useful structures. For example, it is not necessary to maintain one plane of superconductor free of patterning. A case in which both layers are patterned would be a self-resonant microwave coil structure consisting of counterwound spirals on either side of the dielectric layer.

It should also be apparent that there is no requirement for the dielectric layer to be applied equally thickly to both substructures. This is a matter of choice, based on the particular structure being fabricated. It may, for example, be advantageous in some structures to locate the fusion interface at a greater distance from a patterned layer than from an unpatterned one. Similarly, the dielectric need not be applied in a single application to each substructure. It may be desirable to apply the total thickness for a particular substrate in several application steps.

The utility of the technique is, of course, not limited to superconductive components, or even to conductive layers. It is useful for mating a transducer made from, for example, single crystal quartz, to a signal processing circuit fabricated in single crystal silicon. Quartz cannot be grown in single crystal form on silicon, nor can single crystal silicon be grown on quartz. Furthermore, excess capacitance is undesirable in these structures. Thus it can be seen that the bonding technique described herein would be well suited to this type of hybrid circuit as well as to superconductor-semiconductor hybrid structures.

While the foregoing disclosure contains many specificities, these are intended only as examples of particular applications of the bonding technique of the invention. The scope of the invention is to be determined only by the appended claims and their legal equivalents.

What is claimed is:

1. A process for forming a multilayer electrical device structure comprising the steps of:
   preparing a first substrate for epitaxial crystal growth;
   depositing a first crystalline oxide superconducting layer on said first substrate;
   depositing a first thick insulating layer having a dielectric constant of less than 5 on said first crystalline oxide superconducting layer;
   preparing a second substrate for epitaxial crystal growth;
   depositing a second crystalline layer on said second substrate;
   depositing a second thick insulating layer having a dielectric constant of less than 5 on said second crystalline layer;
   bringing the two thick insulating layers into contact;
   and fusing the two thick insulating layers into a single layer, whereby said single layer forms a dielectric between said first crystalline oxide superconducting layer and said second crystalline layer.

2. The process of claim 1 wherein said first crystalline oxide superconducting layer bears an epitaxial relationship to said first substrate, and said second crystalline layer bears an epitaxial relationship to said second substrate.

3. The process of claim 2 wherein the step of preparing said first substrate comprises the step of depositing a buffer layer on said first substrate.

4. The process of claim 3 wherein the step of preparing said first substrate further comprises the steps of:
   depositing a lower layer of crystalline oxide superconducting material on said buffer layer;
   and depositing a thin insulating layer having a dielectric constant of at least 9 epitaxial to said lower layer of crystalline material.

5. The process of claim 4 wherein the step of preparing said first substrate further comprises the step of forming a pattern in said lower layer of crystalline oxide superconducting material.

6. The process of claim 5 further comprising the step of forming a pattern in said first crystalline oxide superconducting layer prior to the deposition of said thick insulating layer.

7. The process of claim 2 wherein the step of preparing said second substrate comprises the step of depositing a buffer layer on said second substrate.

8. The process of claim 7 wherein the step of preparing said second substrate further comprises the steps of:
   depositing a lower layer of crystalline material on said buffer layer;
   and depositing a thin insulating layer having a dielectric constant of at least 9 epitaxial to said lower layer of crystalline material.

9. The process of claim 8 wherein the step of preparing said second substrate further comprises the step of forming a pattern in said lower layer of crystalline material.

10. The process of claim 9 further comprising the step of forming a pattern in said second crystalline layer prior to the deposition of said thick insulating layer.

11. A process for forming a multilayer electrical device structure comprising the steps of:
    preparing a first substrate for epitaxial crystal growth;
    depositing a first buffer layer on said first substrate;
    depositing a first lower layer of crystalline oxide superconducting material on said first buffer layer;
    depositing a first thin insulating layer having a dielectric constant of at least 9 epitaxial to said first lower layer of crystalline oxide superconducting material.
    depositing a first crystalline oxide superconducting layer on said first substrate, epitaxial to said first thin insulating layer;
    depositing a first thick insulating layer having a dielectric constant of less than 5 on said first crystalline oxide superconducting layer;
    preparing a second substrate for epitaxial crystal growth;
    depositing a second buffer layer on said second substrate;
    depositing a second lower layer of crystalline oxide superconducting material on said second buffer layer;,
    depositing a second thin insulating layer having a dielectric constant of at least 9 epitaxial to said second lower layer of crystalline oxide superconducting material.
    depositing a second crystalline oxide superconducting layer on said second substrate, epitaxial to said second thin insulating layer;
    depositing a second thick insulating layer having a dielectric constant of less than 5 on said second crystalline oxide superconducting layers;
    bringing the two thick insulating layers into contact;
    and fusing the two thick insulating layers into a single layer.

12. The process of claim 1, wherein said first substrate is selected from the group consisting of yttria-stabilized zirconia, lanthanum aluminate, neodymium gallate, sapphire, magnesium oxide and strontium titanate.

13. The process of claim 2, wherein said first substrate is selected from the group consisting of yttria-stabilized zirconia, lanthanum aluminate, neodymium gallate, sapphire, magnesium oxide and strontium titanate.

14. The process of claim 3, wherein said superconducting layer is $YBa_2Cu_3$ oxide or a rare earth cuprate.

15. The process of claim 1, wherein said first thick insulating layer is a polyimide or a fluorocarbon polymer.

16. The process of claim 2, wherein said first thick insulating layer is a polyimide or a fluorocarbon polymer.

17. The process of claim 1, wherein said fusing is by application of heat and pressure.

* * * * *